United States Patent
Ohtsubo

(10) Patent No.: US 6,437,626 B1
(45) Date of Patent: Aug. 20, 2002

(54) DEVICE FOR REMOVING NOISE IN AC POWER WAVEFORM

(76) Inventor: Kazuo Ohtsubo, 23-2, Meguro 4-chome, Meguro-ku, Tokyo 153-0063 (JP)

( * ) Notice: Subject to any disclaimer, the term of this patent is extended or adjusted under 35 U.S.C. 154(b) by 0 days.

(21) Appl. No.: 09/786,365
(22) PCT Filed: Sep. 22, 1999
(86) PCT No.: PCT/JP99/05180
§ 371 (c)(1),
(2), (4) Date: Apr. 23, 2001
(87) PCT Pub. No.: WO00/19575
PCT Pub. Date: Apr. 6, 2000

(30) Foreign Application Priority Data

Sep. 29, 1998 (JP) .......................... 10-274434

(51) Int. Cl.⁷ ................................................. H03L 5/00
(52) U.S. Cl. ...................................... 327/314; 327/327
(58) Field of Search ............................... 327/314, 320, 327/325, 310, 317

(56) References Cited

U.S. PATENT DOCUMENTS

| | | | | |
|---|---|---|---|---|
| 3,573,774 A | * | 4/1971 | Olsen ......................... 323/909 |
| 3,731,535 A | * | 5/1973 | Wendt, Jr. ................. 338/22 R |
| 4,217,503 A | * | 8/1980 | Hugel et al. ................. 327/322 |
| 4,668,882 A | * | 5/1987 | Matsuura .................... 327/308 |
| 5,491,452 A | * | 2/1996 | Ohtusubo et al. ........... 136/203 |
| 5,640,127 A | * | 6/1997 | Metz .......................... 327/309 |
| 6,225,861 B1 | * | 5/2001 | Kawai ........................ 327/308 |

* cited by examiner

Primary Examiner—Terry D. Cunningham
(74) Attorney, Agent, or Firm—Bacon & Thomas

(57) ABSTRACT

A "PN junction element ta which produces the Peltier effect and Seebeck effect within the same element and imparts a noise reducing effect," which prevents an adverse influence of white noise included in an AC waveform to be supplied from a commercially available AC power supply or a parasitic noise or the like caused by electromagnetic interference on an electromagnetic device that is supplied with power and which is effective when attached at the designing or manufacturing stage to each "low-power" functional circuit which provides a later-attached or externally-attached device is adapted to a "high-power" circuit. An external attachment unit is constructed by separating at least one of lines between an AC power input terminal IN and an output terminal OUT to an electromagnetic device into parallel branch lines a and b, and connecting the series circuit of a diode da, db and a PN junction element ta, tb to each branch circuit, thereby facilitating its use by ordinary users.

18 Claims, 5 Drawing Sheets

(a)

(b)

DEVICE FOR REMOVING NOISE IN AC POWER WAVEFORM

TECHNICAL FIELD

The present invention relates to an apparatus which eliminates noise in a power waveform and prevents the adverse influence, which is resulted from superimposition of, for example, white noise or parasitic wave noise caused by electromotive interference on the AC waveform that should be a sine waveform to be supplied from, for example, a commercially available AC power supply of 100 V, on electromagnetic devices (including electronic devices) which receive power from such an AC power supply. More specifically, it is an apparatus which generally works for the overall electronic device as it is connected to a power input circuit, not inserted in individual functional circuits in an electric device.

BACKGROUND ART

Conventionally, filters or the like which tune to a specific frequency determined by the time constant of L, C and R and provide individual functional circuits with a function to bypass to the ground or a current element function have been used.

In this type of conventional apparatus, however, as a capacitive impedance or inductive inductance is used, frequency cannot be avoided so that no even effect can be expected over the entire frequency bands and the adverse influence of electromagnetic interference noise could be avoided to a certain, not completely. With regard to white noise, satisfactory results have not been obtained.

That is, it was not possible to avoid deformation of voices in the case of acoustic devices, disturbance of images or hue in the case of video machines, etc., which are caused by noise or interference waves having an unspecific and unstable frequency spectrum from an AC power supply.

Also, within electromagnetic devices, in addition to coils, there are a large number of electrical, electronic parts connected and built in, such as transformers, resistors, condensers, semiconductor elements. The output current including the above standing wave noise is also affected by electrical characteristics such as inductance, conductance, capacitance, etc. possessed by these parts, and the characteristics in material properties such as thermal noise or scattering of electrons. As a result, the standing wave noise of the current particularly around zero current generates more noise with greater energy through interference with the standing noise.

Since these standing wave noises overlap the normal output signal which should be inherently faithful to the input signal, they cannot practically convert the input signal faithfully. Such noises in electromagnetic devices make the conversion of input signals to acoustic, image, data recording, etc. incorrect and indistinct, thereby losing scientific value, artistic nature, and also irritating excessively visual and auditory nerves of man, thus creating harm in social environments, artistic cultures, mental hygienes and scientific techniques. Leaving this undealt with is a significant matter which cannot be allowed from a social point of view.

It is an object of this invention to not only overcome the problems but also provide an apparatus which allow an end user to arbitrarily and easily install it in an electromagnetic device, which is manufactured and delivered by device makers without making such consideration, by merely connecting it to the power input circuit.

DISCLOSURE OF INVENTION

The present inventor is one of patentees of the invention disclosed in Japanese Patent No. 2731456. Paying attention to the characteristics of a PN junction element (thermo module) for improving the sound quality, which is connected to each of the function circuits in "low-power circuits" concerning this invention, the means for solving the above problems is provided by generally applying the characteristics to the power circuits of "high-power circuits."

This PN junction element, which makes a temperature difference by the Peltier effect and generates a thermoelectric current by the Seebeck effect, will be explained as follows referring to claim 1 of the aforementioned patent.

FIG. 6 shows an improved element 61 for an electromagnetic circuit signal waveform which comprises a junction pair having a semiconductor P-type material section 62 and semiconductor N-type material section 63 having thermoelectric powers junctioned at a junction 64, and electrode sections 65 and 66 of the opposite materials on the opposite sides to the junction, and which can produce the Peltier effect and the Seebeck effect in the same element and suppress the inverse electromagnetic induction current that causes standing wave noise by causing the Peltier exotherm to occur at the junction 64 and the Peltier endotherm to occur on both electrode sections 65 and 66 and allowing a transient temperature difference $\Delta Tt$ by the exotherm and endotherm to generate the transient counter electromotive force of the first polarity between the junction 64 and both electrode sections 65 and 66 due to the Seebeck effect, when a current flows in a first direction between the P-type material section 62 and the N-type material section 63, and generating the counter electromotive force of the opposite, second polarity between both electrode sections 65 and 66 by inverting the aforementioned transient temperature difference $\Delta Td$ when a current flows in a second direction opposite to the first direction.

BEST MODE FOR CARRYING OUT THE INVENTION

Figure 6:
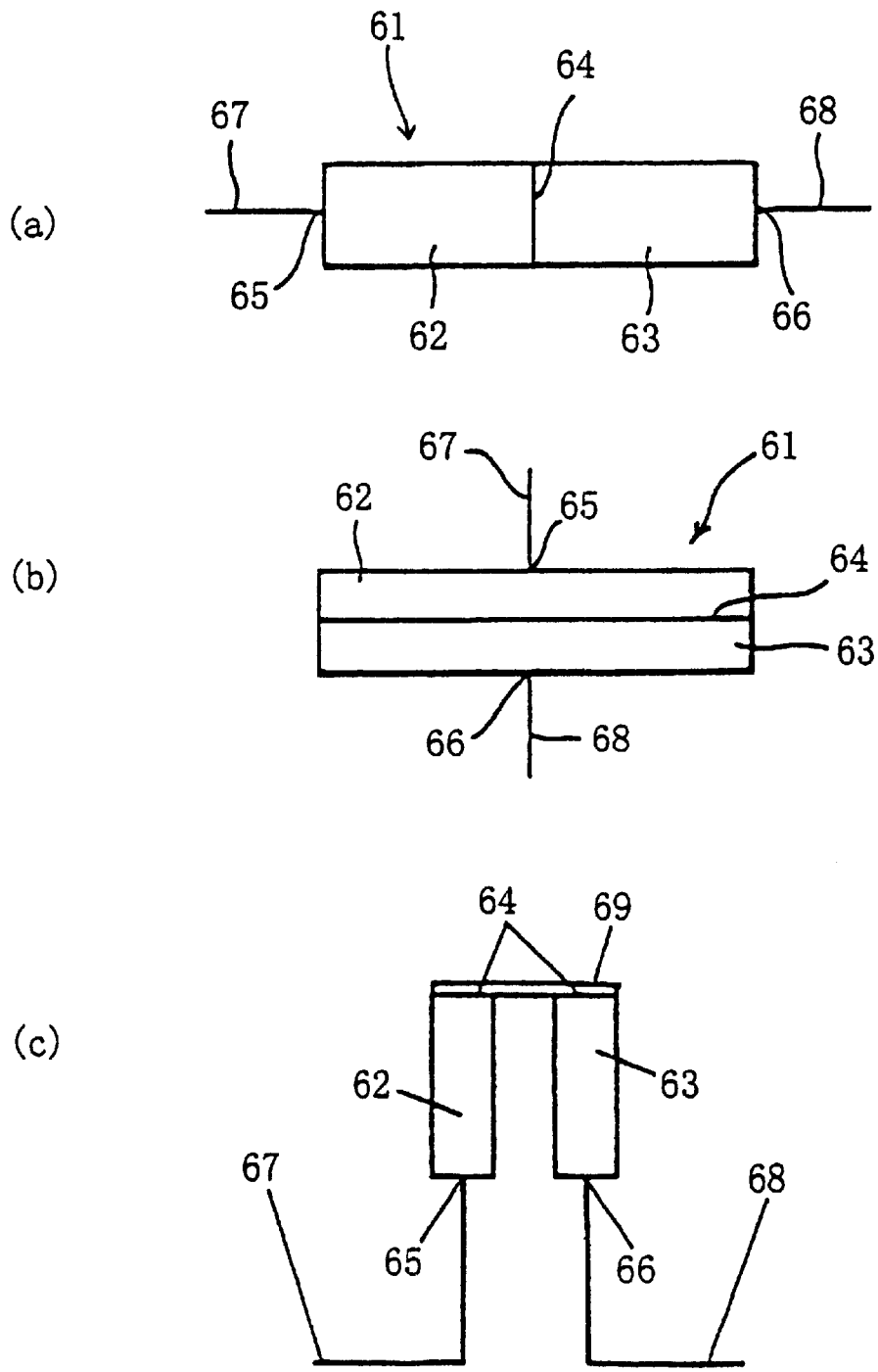
FIG. 6 is an illustration showing an embodiment of the noise eliminating element of the present invention, (a) showing the device having bulk materials junctioned, (b) thin film-thick film materials junctioned, (c) the bulk materials junctioned in the $\pi$ form with a junctioning metal strip and an element of the module type having a plurality of elements connected in series.

The aforementioned sound-quality improving PN junction element 61 shown in FIG. 6 comprises a junction pair having a p-type material 62 and n-type material 63 of different conductivity types, and lead wires 67 and 68 are connected as electrode terminals to material end faces 65 and 66 opposite to the junction 64, respectively forming junction boundary layers. FIG. 6(a) shows a sound-improving element having bulk materials junctioned. FIG. 6(b) shows a sound-improving element having thin-film or thick-film materials junctioned. FIG. 6(c) shows a sound-improving element having bulk materials junctioned in the π form using junctioning metal strip 69.

Given that the absolute thermoelectric power of the P-type material is "αP" and the absolute thermoelectric power of the N-type material is "αN," the relative thermoelectric power αR of the junction pair of both materials is defined as the difference of the absolute thermoelectric powers of both materials (αP−αN). When a current flows in the junction element 61 show in FIG. 6, for example, from the P-type 62 to the N-type 63, the Peltier exotherm αR·I·T proportional to the relative thermoelectric power αR=αP−αN of the element 61, the current I and the absolute temperature T of the junction 64 occurs at the junction 64 and the Peltier endotherms (αP−αCu)·I·T and (αCu−αN)·I·T proportional to the relative thermoelectric power αR of the element 61, the current I and the absolute temperature T of the electrode sections 65 and 66 occur at both electrode sections 65 and 66 so that the total value of those Peltier endotherms becomes αR·I·T. As a result, the temperature of the junction 64 rises and the temperatures of both electrode sections 65 and 66 drop, thereby creating a temperature difference ΔT between the junction 64 and the electrode section 65 or 66 (the temperatures of 65 and 66 are the same). This temperature difference ΔT transiently changes due to the influences of the Joule heat I2R by the electric resistance R of the element and the heat transmission KΔT by the thermal conductance K which is the reciprocal of the thermal resistance.

With respect to an abrupt change in current, however, the influences of the Joule heat and the heat transmission are extremely small and the temperature difference ΔT changes very quickly and transiently mainly by the Peltier endotherm and exotherm, so that when the temperature of the junction 64 becomes Th and the temperatures of both electrode sections 65 and 66 both become Tc, at which point there should not be any temperature difference between both electrode sections 65 and 66, a transient temperature difference ΔTt=Th−Tc is produced between the junction 64 and both electrode sections 65 and 66.

This generated transient temperature difference ΔTt provides a transient counter electromotive force αRΔT proportional to the relative thermoelectric power αR of the element between the junction 64 and both electrode sections 65 and 66 due to the Seebeck effect. When the transient current flows to the N-type 63 from the P-type 62, the electrode 65 has a positive polarity and the electrode 66 has a negative polarity. When the current flowing in the element is reversed, the temperature of the junction, the temperatures of both electrode sections and the polarities of the electrodes are reversed.

Since those Peltier endotherm and exotherm and the Seebeck counter electromotive force are generated by the extremely fast behavior of electrons in the junction boundary layers between the junction 64 and both electrode sections 65 and 66 of the element, they are generated in the vicinity of the output current of 0 by the inductance component of a coil when the direction of the current flowing in a coil circuit of an electromagnetic device is abruptly reversed, thereby quickly suppressing the inverse electromagnetic induction current that causes standing wave noise and keeping the output signal at the normal waveform, which brings about a significant improvement.

As materials of different conductivity types, as seen from FIG. 8 showing metals and compounds whose absolute thermoelectric powers have been measured and which are shown as a series of thermoelectric powers in the order of level, there are materials having large positive and negative absolute thermoelectric powers. A suitable material would be a thermoelectric semiconductor material. Because this material has a large absolute thermoelectric power α and a large conductance σ and a low thermal conductivity κ in the temperature range to be used, the effects of the generation of the temperature difference $\Delta T_1$ and the generation of the counter electromotive force αΔT for the same current are great. $z=\alpha^2\sigma/\kappa$ is generally called the performance index of a thermoelectric material, and a junction element using a material having a large performance index is considered as a sound-quality improving element.

More specifically, examples of materials to be used for elements which have been recognized as a sound-quality improving element are at present bismuth-tellurium based materials that have a large performance index z (see the equation given on the ninth previous line) near the ordinary temperature.

One example of the p-type material is $(Sb_2Te_3)_A(Bi_2Te_3)_B(Sb_2Se_3)_C$ where Te is added as a donor to A=70–72, B=23–27 and C=3–5. One example of the n-type material is $(Bi_2Te_3)_D(Sb_2Te_3)_E(Bi_2Se_3)_F$ where a metal halogen compound like $SbI_3$ or $HgBr_2$ is added donor to D=90–98, E=0–50 and F=2–5.

Figure 7:
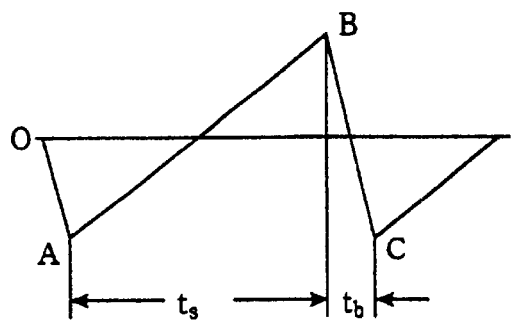
FIG. 7 is an illustration showing the "saw" wave forms, (a) showing the normal "saw" wave form and (b) an irregular "saw" wave form overlapped with standing wave noise.
Figure 7:
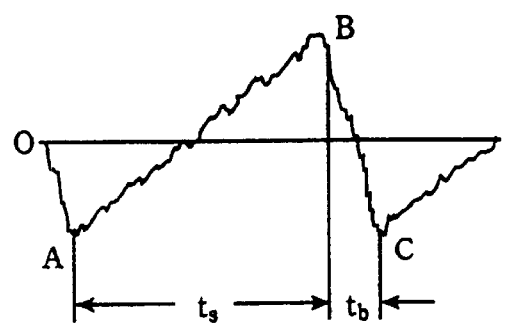

FIG. 7 exemplifies a case of the aforementioned PN junction element comprised of such materials used in, for example, a horizontal or vertical deflection circuit in a TV. (a) in FIG. 7 shows a normal "saw" wave, and (b) an irregular "saw" wave on which standing wave noise is superimposed. Although the latter degrades the quality of images, serially connecting the PN junction element in the circuit can provide an effect of returning it to the normal "saw" wave (a).

For instance, the AC current having a frequency of 50 Hz which is supplied to the users by The Tokyo Electric Power Company changes the direction of its flow every 1/100 second. Because electrons have a mass and thus has inertia, the flow of electrons that form the current cannot respond to such a directional change every 1/100 second (cannot stop abruptly) and the electrons collide one another to go into a chaotic state. This state generates white noise.

This invention has a particular significance in preventing collision of electrons from one another by the chaotic state of the electrons and employing a noise reducing element which is characterized in "making a temperature difference by the Peltier effect and generating a thermoelectric current by the Seebeck effect" in order to achieve such an aim in connection to a solution to the problems without touching the internal structure of an image display device for, for example, a home-use audio device, TV or the like at the stage of receiving the commercially available AC power from its power supply.

Although this invention can also be embodied in a polyphase AC power supply circuit, for example, 3-phase AC power supply circuit, a single-phase AC 100-V power supply circuit will be described below as an embodiment. While the commercially available AC power is normally supplied on 100 V in Japan, design modification is possible to match with a voltage of 200 V for power voltage supplies or a voltage of 220 V or higher in foreign countries. If the circuit is designed in consideration of the breakdown voltage, there is no upper limit of the voltage and it is possible to cope with the high voltage of a power distribution circuit or the super high voltage of a transmission circuit. It is possible to change the design to the one for a high current or high power capacity by selecting the current capacitances of the diode and PN junction element in accordance with the target values.

Figure 1:
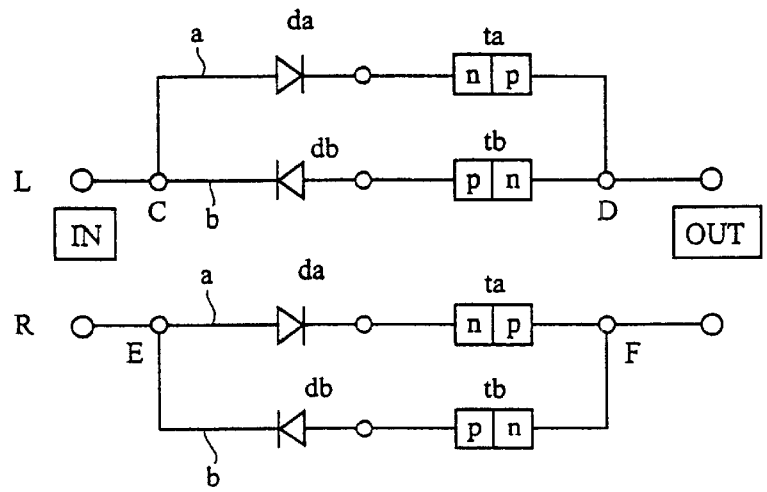
FIG. 1 is a circuit structural diagram illustrating a first embodiment of an apparatus according to this invention.

In the basic circuit shown in FIG. 1, two lines L and R (note: although the exemplified case is for single-phase AC, there are three lines in the case of three-phase AC) between the AC input (IN) and output (OUT) are each separated into a branch line a and a branch line b connected in parallel to each other, and the branch line a forms a forward current circuit C-a-da-ta-D which is the series connection of a diode da to a PN junction element ta that can cause the Peltier effect and Seebeck effect in the same element while the branch line b forms a reverse current circuit C-b-db-tb-D which is the series connection of a diode db to the PN junction element tb. That is, the PN junction element ta on the line a is connected in such a direction that the junction will be cooled when a DC current rectified by the diode da flows in the PN junction element.

The line b has a similar circuit structure and a device which is a load is connected to the (OUT) of this circuit. When this device is used, a pulsating current by half-wave rectification flows in the PN junction element ta in a given direction and the junction is cooled by the Peltier effect, making a temperature difference which, because of the Seebeck effect, turns this device into a heat generator to transform the current containing noise input from the input side to the flow of thermoelectrons which is in turn forced to be supplied.

Although FIG. 1 shows the state in which the two lines L and R are each separated into the branch lines a and b to form series circuits of diodes and PN junction elements, only one of the two lines L or R may be separated into branch lines with the remaining line left in the normal state (i.e., the aforementioned series circuit is not formed).

Figure 2:
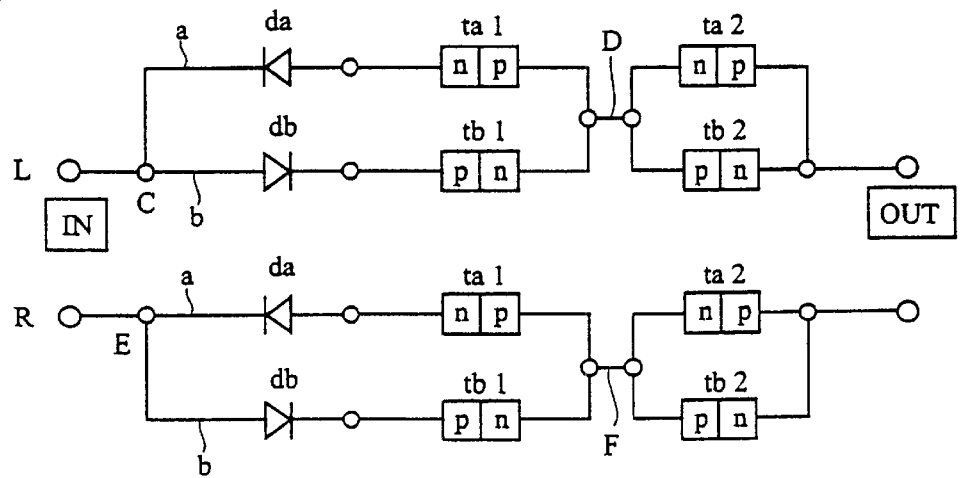
FIG. 2 is a circuit structural diagram illustrating a second embodiment of an apparatus according to this invention.

FIG. 2 shows insertion of PN junction in the output side of the circuit in FIG. 1 in the form of a connection loop with the NP direction reversed, and this operation is such that the junction of one of two elements becomes cooled while the other becomes heated and a thermal cell is short-circuited, so that a large current is produced in this loop. The current in this loop carries electrons in accordance with a variation in the load of the device that is connected to the (OUT) and forces to send them to the ground. When a reflected wave comes out of the device side, it is absorbed.

Figure 3:
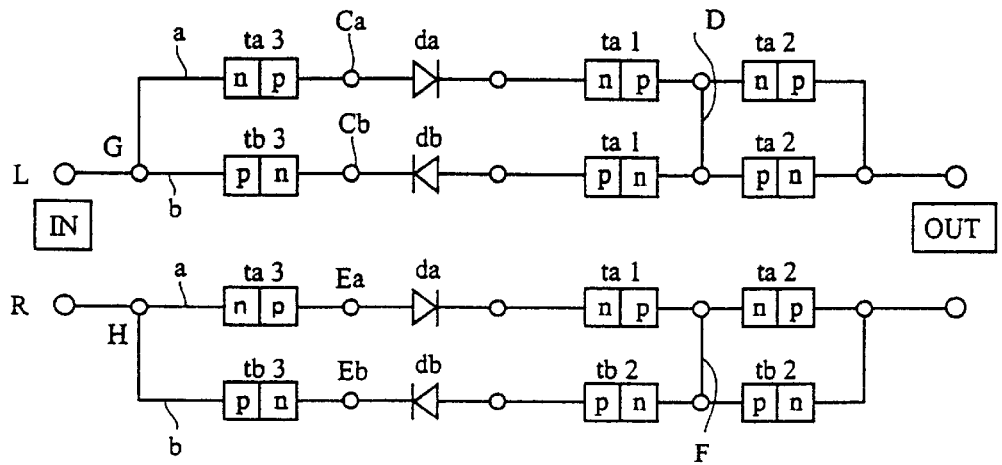
FIG. 3 is a circuit structural diagram showing a third embodiment of an apparatus according to this invention.

FIG. 3 shows a PN junction element ta also inserted before the diode of the circuit in FIG. 2 or on the input side thereof. In an experiment with a 37-inch TV, both the image quality and sound quality got better using the circuit in FIG. 1 than those before the use. The circuit in FIG. 2 made them higher than the one in FIG. 1, and the circuit in FIG. 3 improved them further. Inserting a loop-like noise eliminating element reverse-connected to the (IN) line as in FIG. 4 resulted in a further improvement.

FIG. 6 presents an enlarged illustration and the actual dimension of the element is significantly smaller. For example, the dimension (height×depth×length) of an element with a current capacitance of 10 amperes is about 2 mm×2 mm×3 mm, the dimension of even an element with a current capacitance of 50 amperes is about 5 mm×5 mm×3 mm, the cross-sectional area is approximately proportional to the flow rate of the current and the length is about 3 mm.

Figure 5:
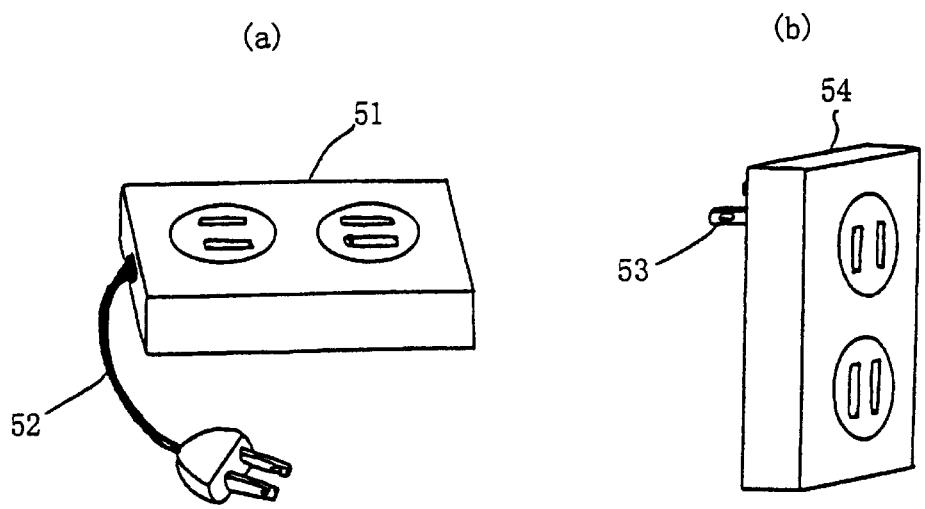
FIG. 5(a) is a diagram showing a power outlet with an extension cord, and (b) is a diagram showing a plug-in type power outlet which is to be directly plugged in a wall outlet.

FIG. 5(a) shows one example of an outlet 51 with an extension and attachment plug cord 52 and FIG. 5(b) shows one example of an outlet 54 with a plug 53 to be plugged in a wall outlet, both so constructed as to allow a user who uses, for example, the commercially available AC power supply of 100 V to easily connect and use as the operational power supply for an electronic device such as an acoustic device or a video machine. The electric circuits shown in FIGS. 1 to 3 are each installed in the casing shown in FIG. 5.

As other embodiments, for example, the circuit may be designed so as to be connected between a single line and one terminal of a current limiter in, for example, a fuse box or may be designed to have the shape and dimension that match with the specifications of a fuse used in a fuse box and can be replaced together with the original fuse.

Industrial Applicability

It is known that the PN junction element which can produce the Peltier effect and Seebeck effect within the same element can fundamentally provide a special noise eliminating effect when attached to a functional circuit like an audio voice outputting circuit or a video image outputting circuit at the design stage or the manufacturing stage.

It is known that inserting the aforementioned PN junction element in the horizontal or vertical deflection circuit in a TV shown in FIG. 7, for instance, can provide an effect of returning the irregular "saw" wave, which has standing wave noise superimposed thereon as shown in FIG. 7(b) and has degraded the image quality, to the normal "saw" wave (a).

But, as this apparatus is designed into an attachment unit which can optionally and easily be inserted by a user between an electromagnetic device in which no such consideration has been given and the AC power supply, merely supplying AC power to, for example a TV via this apparatus can transform the TV in use into a natural TV which is "friendly to the eyes and ears of a man." That is, there are effects of eliminating the noise-oriented eddy flow which is produced in the commercially available AC power supply, significantly reducing the fluorescent colors on the TV screen and the static electricity and changing noisy sounds to ear-friendly sounds.

Figure 4:
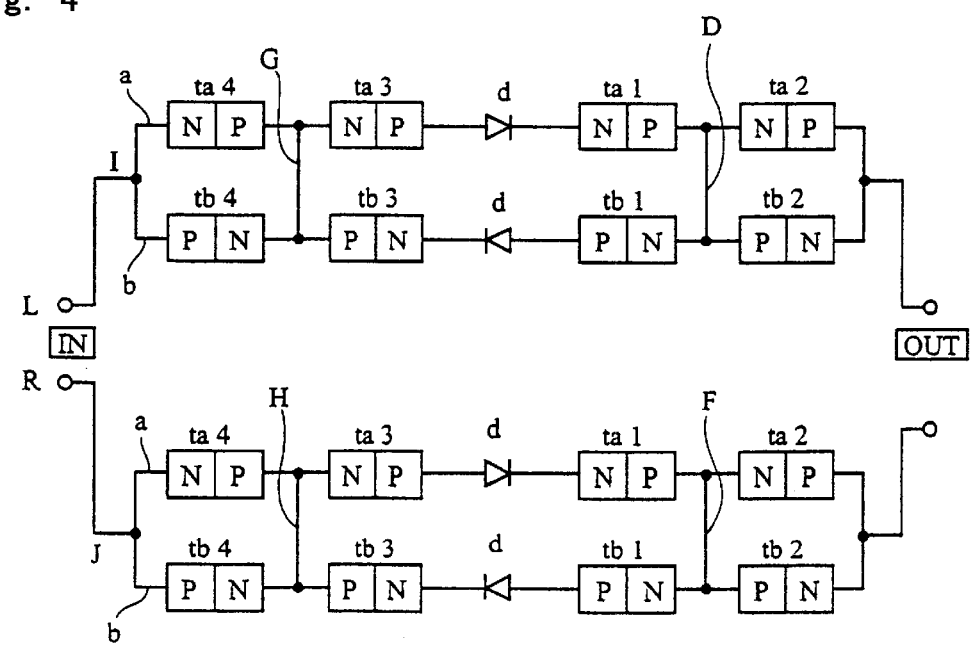
FIG. 4 is a circuit structural diagram showing a fourth embodiment of an apparatus according to this invention.

As the circuit structure becomes multiplexed from the one shown in FIG. 1 to the one shown in FIG. 4, the effects are further enhanced. Video images on the TV screen which especially show prominent effects are as follows.

(1) Video images in the natural light (water, mountains, grasses and flowers)
(2) Human faces
(3) Sports that change fast (baseball, sumo wrestling and figure skating)
(4) Fashion (colorful one)
(5) Gourmets (the same as above)
(6) Movies through VTR

What is claimed is:

1. An apparatus for eliminating noise in an AC power waveform, which is connected between an AC power supply and a power input of an AC electromagnetic device in order to eliminate noise in an AC power waveform, characterized in that:

at least one of lines of individual phases (e.g., L and R) of said AC power supply is separated into a branch line a and a branch line b connected in parallel;

each of said parallel-connected branch lines a and b forms a series circuit of a single PN junction element ta capable of producing a Peltier effect and Seebeck effect within the same element and a single diode d;

said parallel-connected branch lines a and b are connected at an input-side node C or E and an output-side node D or F, forming a circulating current loop;

an AC power input terminal (IN) is provided with an input connector, an attachment plug or an attachment plug with a power cord; and an AC power output terminal (OUT) is provided with an output connector, an outlet or an outlet with an extension cord.

2. The apparatus according to claim 1, characterized in that PN junction elements ta2 and tb2 reversely connected in parallel are connected in series between said output-side node D or F of said parallel-connected branch lines a and b and an output (OUT).

3. The apparatus according to claim 2, characterized in that PN junction element ta3 is connected in series in a forward direction between an anode of that diode which is located on the input side of said each branch line a and said input (IN) terminal and said PN junction element ta3 is connected in series in a reverse direction between a cathode of that diode which is located on the input side of said each branch line b and said input (IN) terminal.

4. The apparatus according to claim 3, characterized in that PN junction elements ta4 and tb4 reversely connected in parallel are connected in series between a node G or H of said lines on an input side of said PN junction elements ta3 and tb3 and an input (In).

5. The apparatus according to claim 1, characterized in that a circuit from said input terminal of at least one of lines of individual phases of said AC power supply to an output terminal is retained in an electrically insulated case.

6. The apparatus according to claim 1, characterized in that when input AC power is a three-phase alternating current, input lines for said alternating current consist of three lines and a circuit structure of each line.

7. The apparatus according to claim 1, characterized in that as said PN junction element capable of producing said Peltier effect and Seebeck effect within the same element, an improved element 61 for an electromagnetic waveform is used which comprises a junction pair having a semiconductor P-type material section 62 and semiconductor N-type material section 63 having thermoelectric powers junctioned at a junction 64, and electrode sections 65 and 66 of opposite materials on opposite sides to said junction, and which can produce said Peltier effect and said Seebeck effect in the same element by causing a Peltier exotherm to occur at said junction 64 and a Peltier endotherm to occur on both electrode sections 65 and 66 and allowing a transient temperature difference $\Delta Tt$ by said exotherm and endotherm to generate a transient counter electromotive force of a first polarity between said junction 64 and both electrode sections 65 and 66 due to said Seebeck effect, when a current flows in a first direction between said P-type material section 62 and said N-type material section 63, and generating a counter electromotive force of an opposite, second polarity between both electrode sections 65 and 66 by inverting said transient temperature difference $\Delta Td$ when a current flows in a second direction opposite to said first direction.

8. The apparatus according to claim 2, characterized in that a circuit from said input terminal of at least one of lines of individual phases of said AC power supply to an output terminal is retained in an electrically insulated case.

9. The apparatus according to claim 3, characterized in that a circuit from said input terminal of at least one of lines of individual phases of said AC power supply to an output terminal is retained in an electrically insulated case.

10. The apparatus according to claim 4, characterized in that a circuit from said input terminal of at least one of lines of individual phases of said AC power supply to an output terminal is retained in an electrically insulated case.

11. The apparatus according to claim 2, characterized in that when input AC power is a three-phase alternating current, input lines for said alternating current consist of three lines and a circuit structure of each line.

12. The apparatus according to claim 3, characterized in that when input AC power is a three-phase alternating current, input lines for said alternating current consist of three lines and a circuit structure of each line.

13. The apparatus according to claim 4, characterized in that when input AC power is a three-phase alternating current, input lines for said alternating current consist of three lines and a circuit structure of each line.

14. The apparatus according to claim 2, characterized in that as said PN junction element capable of producing said Peltier effect and Seebeck effect within the same element, an improved element 61 for an electromagnetic waveform is used which comprises a junction pair having a semiconductor P-type material section 62 and semiconductor N-type material section 63 having thermoelectric powers junctioned at a junction 64, and electrode sections 65 and 66 of opposite materials on opposite sides to said junction, and which can produce said Peltier effect and said Seebeck effect in the same element by causing a Peltier exotherm to occur at said junction 64 and a Peltier endotherm to occur on both electrode sections 65 and 66 and allowing a transient temperature difference $\Delta Tt$ by said exotherm and endotherm to generate a transient counter electromotive force of a first polarity between said junction 64 and both electrode sections 65 and 66 due to said Seebeck effect, when a current flows in a first direction between said P-type material section 62 and said N-type material section 63, and generating a counter electromotive force of an opposite, second polarity between both electrode sections 65 and 66 by inverting said transient temperature difference $\Delta Td$ when a current flows in a second direction opposite to said first direction.

15. The apparatus according to claim 3, characterized in that as said PN junction element capable of producing said Peltier effect and Seebeck effect within the same element, an improved element 61 for an electromagnetic waveform is used which comprises a junction pair having a semiconductor P-type material section 62 and semiconductor N-type material section 63 having thermoelectric powers junctioned at a junction 64, and electrode sections 65 and 66 of opposite materials on opposite sides to said junction, and which can produce said Peltier effect and said Seebeck effect in the same element by causing a Peltier exotherm to occur at said junction 64 and a Peltier endotherm to occur on both electrode sections 65 and 66 and allowing a transient temperature difference $\Delta Tt$ by said exotherm and endotherm to generate a transient counter electromotive force of a first polarity between said junction 64 and both electrode sections 65 and 66 due to said Seebeck effect, when a current flows in a first direction between said P-type material section 62 and said N-type material section 63, and generating a counter electromotive force of an opposite, second polarity between both electrode sections 65 and 66 by inverting said transient temperature difference $\Delta Td$ when a current flows in a second direction opposite to said first direction.

16. The apparatus according to claim 4, characterized in that as said PN junction element capable of producing said Peltier effect and Seebeck effect within the same element, an improved element 61 for an electromagnetic waveform is used which comprises a junction pair having a semiconductor P-type material section 62 and semiconductor N-type material section 63 having thermoelectric powers junctioned at a junction 64, and electrode sections 65 and 66 of opposite materials on opposite sides to said junction, and which can produce said Peltier effect and said Seebeck effect in the same element by causing a Peltier exotherm to occur at said junction 64 and a Peltier endotherm to occur on both electrode sections 65 and 66 and allowing a transient temperature difference ΔTt by said exotherm and endotherm to generate a transient counter electromotive force of a first polarity between said junction 64 and both electrode sections 65 and 66 due to said Seebeck effect, when a current flows in a first direction between said P-type material section 62 and said N-type material section 63, and generating a counter electromotive force of an opposite, second polarity between both electrode sections 65 and 66 by inverting said transient temperature difference ΔTd when a current flows in a second direction opposite to said first direction.

17. The apparatus according to claim 5, characterized in that as said PN junction element capable of producing said Peltier effect and Seebeck effect within the same element, an improved element 61 for an electromagnetic waveform is used which comprises a junction pair having a semiconductor P-type material section 62 and semiconductor N-type material section 63 having thermoelectric powers junctioned at a junction 64, and electrode sections 65 and 66 of opposite materials on opposite sides to said junction, and which can produce said Peltier effect and said Seebeck effect in the same element by causing a Peltier exotherm to occur at said junction 64 and a Peltier endotherm to occur on both electrode sections 65 and 66 and allowing a transient temperature difference ΔTt by said exotherm and endotherm to generate a transient counter electromotive force of a first polarity between said junction 64 and both electrode sections 65 and 66 due to said Seebeck effect, when a current flows in a first direction between said P-type material section 62 and said N-type material section 63, and generating a counter electromotive force of an opposite, second polarity between both electrode sections 65 and 66 by inverting said transient temperature difference ΔTd when a current flows in a second direction opposite to said first direction.

18. The apparatus according to claim 6, characterized in that as said PN junction element capable of producing said Peltier effect and Seebeck effect within the same element, an improved element 61 for an electromagnetic waveform is used which comprises a junction pair having a semiconductor P-type material section 62 and semiconductor N-type material section 63 having thermoelectric powers junctioned at a junction 64, and electrode sections 65 and 66 of opposite materials on opposite sides to said junction, and which can produce said Peltier effect and said Seebeck effect in the same element by causing a Peltier exotherm to occur at said junction 64 and a Peltier endotherm to occur on both electrode sections 65 and 66 and allowing a transient temperature difference ΔTt by said exotherm and endotherm to generate a transient counter electromotive force of a first polarity between said junction 64 and both electrode sections 65 and 66 due to said Seebeck effect, when a current flows in a first direction between said P-type material section 62 and said N-type material section 63, and generating a counter electromotive force of an opposite, second polarity between both electrode sections 65 and 66 by inverting said transient temperature difference ΔTd when a current flows in a second direction opposite to said first direction.

* * * * *